(12) United States Patent
Yu

(10) Patent No.: US 6,534,373 B1
(45) Date of Patent: Mar. 18, 2003

(54) MOS TRANSISTOR WITH REDUCED FLOATING BODY EFFECT

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/817,919

(22) Filed: Mar. 26, 2001

(51) Int. Cl.[7] .............................................. H01L 21/331
(52) U.S. Cl. ...................................... 438/372; 438/305
(58) Field of Search ................................ 438/162, 217, 438/231, 257, 286, 290, 301, 305, 525, 528, 306, 372, 373, 376

(56) References Cited

U.S. PATENT DOCUMENTS

| | | | |
|---|---|---|---|
| 5,366,915 A | | 11/1994 | Kodama |
| 5,423,286 A | * | 6/1995 | Yonehara |
| 5,976,937 A | * | 11/1999 | Rodder et al. |
| 6,008,098 A | * | 12/1999 | Pramanick et al. |
| 6,008,099 A | * | 12/1999 | Sultan et al. |
| 6,268,640 B1 | | 7/2001 | Park et al. |
| 6,297,104 B1 | * | 10/2001 | Tyagi et al. |
| 6,303,450 B1 | | 10/2001 | Park et al. |

OTHER PUBLICATIONS

U.S. patent application Ser. No. 09/803,831 filed Mar. 12, 2001 entitled "Method of Fabricating Abrupt Source/Drain Junctions" by Yu. Attorney Dkt. No. (39153/411).

* cited by examiner

Primary Examiner—David Nelms
Assistant Examiner—Phuc T. Dang
(74) Attorney, Agent, or Firm—Foley & Lardner

(57) ABSTRACT

A method of fabricating an integrated circuit utilizes asymmetric source/drain junctions. The process can be utilized for P-channel or N-channel metal oxide field semiconductor effect transistors (MOSFETS). The drain extension is deeper than the source extension. The source extension is more conductive than the drain extension. The transistor has reduced short channel effects and strong drive current and yet is reliable.

20 Claims, 1 Drawing Sheet

MOS TRANSISTOR WITH REDUCED FLOATING BODY EFFECT

FIELD OF THE INVENTION

The present specification relates to integrated circuits and methods of manufacturing integrated circuits. More particularly, the present specification relates to a transistor having a specialized source or drain junction and a method of manufacturing it.

BACKGROUND OF THE INVENTION

Currently, deep-submicron complementary metal oxide semiconductor (CMOS) is the primary technology for ultra-large scale integrated (ULSI) devices. Over the last two decades, reducing the size of CMOS transistors and increasing transistor density on ICs has been a principal focus of the microelectronics industry. An ultra-large scale integrated circuit can include over 1 million transistors. Transistors, such as, metal oxide semiconductor field effect transistors (MOSFETs), are generally bulk semiconductor-type devices or silicon-on-insulator (SOI)-type devices.

In bulk semiconductor-type devices, transistors, such as, MOSFETs are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of the depletion layer below the inversion channel) must be scaled down to achieve superior short channel performance.

According to conventional complimentary metal oxide semiconductor (CMOS) fabrication techniques, the reduction of the depletion layer thickness is realized by a super-steep retrograded well (SSRW) ion implantation process. However, this process is limited by the diffusion of dopant atoms during subsequent thermal processes (e.g., annealing). The ion implantation process can generally only achieve an 80-nanometer or larger body thickness for a transistor. Thus, conventional fabrication techniques for bulk semiconductor type-devices cannot create transistors with a body thickness less than 80 nm.

Accordingly, bulk semiconductor-type devices can be subject to disadvantageous properties due to the relatively large body thicknesses. These disadvantageous properties include less than ideal sub-threshold voltage rolloff, short channel effects, and drain induced barrier lowering. Further still, bulk semiconductor-type devices can be subject to further disadvantageous properties such as high junction capacitance, ineffective isolation, and low saturation current. These properties are accentuated as transistors become smaller and transistor density increases on ICs.

Conventional SOI-type devices include an insulative substrate attached to a thin film semiconductor substrate which contains transistors similar to the MOSFET described with respect to bulk semiconductor-type devices. The transistors have superior performance characteristics due to the thin film nature of the semiconductor substrate and the insulative properties of the insulative substrate. The superior performance is manifested in superior short channel performance (i.e., resistance to process variation in small size transistor), near-ideal subthreshold voltage swing (i.e., good for low off-state current leakage), and high saturation current. SOI transistors do not typically include high-k gate dielectric materials.

According to one example of an SOI-type device, a partially-depleted SOI MOSFET has advantages (e.g., reduced source/drain junction capacitance, latch-up free, etc.) over bulk-type MOSFETs. However, partially depleted SOI MOSFETs as well as other types of SOI devices are susceptible to floating-body effect (FBE). For example, a major drawback for the use of SOI technology in memory is related to instability caused by floating-body effect.

Floating-body effect is caused by impact ionization in the channel region during on-state operation. The impact ionization typically occurs near the drain side of the channel region. Majority carriers (e.g., holes in an N-channel MOSFET) accumulate in the body of the SOI transistor.

The accumulation of carriers increases a potential between the channel region and the drain region. The increased potential reduces the threshold voltage of the transistor, thereby adversely affecting the stability and power consumption of the transistor. A reduced threshold voltage for the transistor increases the off-state current and on-state current of the transistor. Ideally, transistors are designed to suppress or avoid floating-body effect if possible.

Complex transistor designs are often required to reduce floating body effect. For example, substrate contact schemes, such as a low barrier body contact (LBBC) scheme, have been utilized to provide a substrate contact for substrate current collection for the SOI substrate, thereby reducing the floating-body effect. However, providing substrate contacts on an SOI substrate requires space and can add process complications.

Thus, there is a need for a method of manufacturing thin film, partially depleted MOSFET which has advantages over conventional bulk type devices. Further still, there is a need for a method of manufacturing a transistor which has superior short-channel performance, near ideal subthreshold swing, and high saturation current and yet is not susceptible to floating body effect. Even further still, there is a need for a process for making a thin film transistor which has a specialized source/drain region that reduces floating body effect.

SUMMARY OF THE INVENTION

An exemplary embodiment relates to a method of manufacturing an integrated circuit. The method includes providing a gate structure between a source location and a drain location on a semiconductor film, providing a source region at the source location and a drain region at the drain location, and providing an angled dopant implant. The angled dopant implant forms an amorphous region in the film. The method further includes annealing the film to recrystallize the amorphous region.

Still another exemplary embodiment relates to a method of manufacturing an SOI transistor having reduced floating body effects. The method includes steps of providing at least part of a gate structure on a top surface of a semiconductor substrate and doping a deep source region and a deep drain region in a semiconductor substrate. The gate structure includes a pair of spacers. The method further includes doping the entire deep source region under one of the spacers while not doping the deep drain region under the other of the spacers, and annealing the semiconductor substrate.

Still another exemplary embodiment relates to a method of doping a source region and/or a drain region for a transistor. The transistor includes a gate structure disposed over a channel in a substrate, a source region heavily doped with dopants of a first conductivity type, and a drain region heavily doped with dopants of the first conductivity type. The method includes amorphizing the substrate at an angle with dopants of the first conductivity type. The method further includes annealing the substrate. An abrupt junction in the lateral direction for the source region or the drain region is formed. The source region and the drain region are asymmetrical.

BRIEF DESCRIPTION OF THE DRAWINGS

Exemplary embodiments will hereafter be described with reference to the accompanying drawings wherein like numerals denote like elements, and.

DETAILED DESCRIPTION OF THE PREFERRED EXEMPLARY EMBODIMENTS

Figure 1:
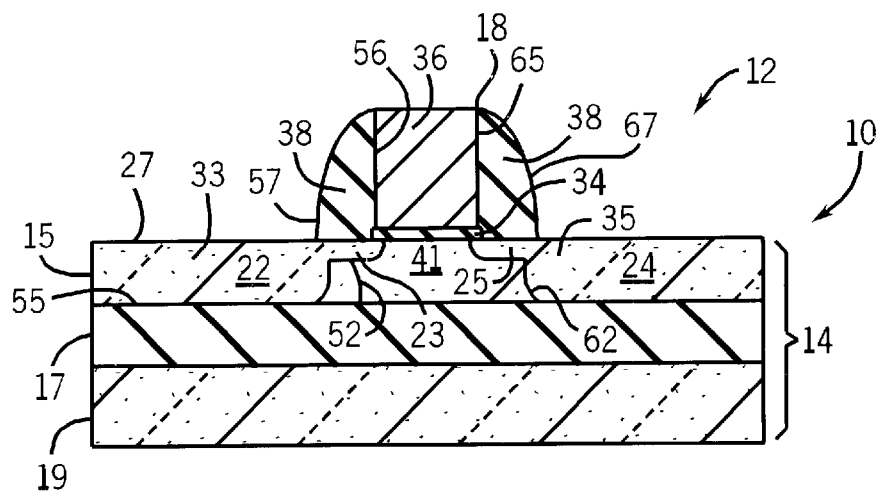
FIG. 1 is a cross-sectional view of a portion of an integrated circuit having a transistor with a specialized source region in accordance with an exemplary embodiment.

With reference to FIG. 1, a transistor 12 is disposed on a semiconductor substrate 14, such as, a silicon wafer. Transistor 12 is part of a portion 10 of an integrated circuit (IC) manufactured on a wafer (such as, a silicon wafer). Transistor 12 is preferably a thin film, partially-depleted SOI MOSFET.

Transistor 12 can be an N-channel or a P-channel field effect transistor, such as, a metal oxide semiconductor field effect transistor (MOSFET). Transistor 12 is described below as an N-channel transistor.

Semiconductor substrate 14 is preferably a semiconductor-on-insulator (SOI) substrate (e.g., a silicon-on-glass substrate). Alternatively, substrate 14 can be any type of IC substrate including a gallium arsenide (GaAs), germanium, or a bulk P-type silicon substrate.

Substrate 14 preferably includes a thin or ultra-thin semiconductor layer 15, a thick insulative layer 17, and a base layer 19. Base layer 19 can be any support medium, such as a semiconductor base layer. Alternatively, substrate 14 can consist of only layer 15 and layer 17 without base layer 19.

Insulative layer 17 can be a 500–2000 Å thick silicon dioxide material. Semiconductor layer 15 can be a 50–200 nanometer thick single crystalline silicon film. Alternatively, a film or layer 15 can include other semiconductor materials, such as, germanium, and can be amorphous or polycrystalline. Preferably, layer 15 is single crystalline so it can act as a seed layer in a subsequent solid phase epitaxy process step.

Transistor 12 includes a gate structure 18, a source region 22, and a drain region 24. Regions 22 and 24 extend from a top surface 27 of layer 15 to a bottom 55 of layer 15 (top surface of layer 17). Regions 22 and 24 are preferably 50 nanometers (nm)–200 nm thick from surface 27 to bottom 55 (junction depth) and include a source extension 23 and a drain extension 25. For an N-channel transistor, regions 22 and 24 are heavily doped with N-type dopants (e.g., $5 \times 10^{19}$–$1 \times 10^{20}$ dopants per cubic centimeter). For a P-channel transistor, regions 22 and 24 are heavily doped with P-type dopants (e.g., $5 \times 10^{19}$–$1 \times 10^{20}$ dopants per cubic centimeter).

Extensions 23 and 25 are preferably shallow extensions (e.g., junction depth is less than 50 nm (15–40 nm)), which are thinner than regions 22 and 24. Extensions 23 and 25 are connected to regions 22 and 24, respectively, and are disposed partially underneath gate structure 18. Extensions 23 and 25 can be ultra-shallow to help transistor 12 achieve substantial immunity to short-channel effects. Short-channel effects can degrade performance of transistor 12 as well as the manufacturability of the IC associated with transistor 12.

Regions 22 and 24 and extensions 23 and 25 have a concentration of $10^{19}$ to $10^{20}$ dopants per cubic centimeter. An appropriate dopant for a P-channel transistor is boron, boron diflouride, or iridium, and an appropriate dopant for an N-channel transistor is arsenic, phosphorous, or antimony.

Gate structure 18 has a height or thickness of 500–2000 Å. Gate stack or structure 18 includes a gate dielectric layer 34 and a gate conductor 36. Dielectric layer 34 is preferably comprised of a thermally grown, 15–25 Å thick silicon dioxide material. Alternatively, deposited silicon dioxide, nitride ($Si_3N_4$) material, or high K gate dielectric materials can be utilized.

Gate structure 18 can also include a pair of spacers 38. Spacers 38 can be manufactured in a conventional deposition and etch back process. Preferably, spacers 38 are manufactured from silicon dioxide and are 500–2000 Å in height (thick) and 300–1000 Å wide. Alternatively, other insulative material, such as silicon nitride, can be utilized to form spacers 38.

Conductor 36 is disposed between a source location associated with region 22 and a drain location associated with region 24. Conductor 36 is preferably doped polysilicon. Alternatively, conductor 36 can be metal, such as a refractory metal, or include germanium to adjust the work function of transistor 12.

Gate structure 18 is disposed over a channel region 41. Channel region 41 is between extensions 23 and 25. Drain region 22 includes deep drain region 35 and source region 22 includes deep source region 33. Regions 33 and 35 are deeper than extensions 23 and 25.

Source region 22 includes an abrupt junction 52 extending in a vertical direction from extension 23 to bottom 55. Extension 23 has a width (left-to-right) of 300–1000 Å and extension 25 has a width of 300–1000 Å.

Junction 52 is disposed underneath spacer 38 closer to an edge 56 of conductor 36 than an edge 57 of spacer 38. In contrast, a junction 62 (below extension 25) of source region 24 is disposed closer to an edge 67 of spacer 38 than an edge 65 of gate conductor 36. Accordingly, source region 22 and drain region 24 are asymmetrical.

In one preferred embodiment, junction 52 extends 3000–600 Å from bottom 55 to extension 23 and is disposed laterally approximately less than 300 Å from edge 56 (e.g., 30–80 percent of the distance between edge 57 and edge 56). Junction 52 can have a slightly rounded (e.g., reverse C-shaped) profile.

Junction 52 is preferably very abrupt and on the side of source region 22 of transistor 12. Preferably, junction 52 is so abrupt and heavily doped that carrier injection efficiency is very high.

The combination between electrons and holes at junction 52 helps reduce floating body potential buildup and hence, reduces floating body effects. The carriers are electrons for N-channel MOSFETs and holes for P-channel MOSFETs. Thus, junction 52 is a very abrupt junction disposed in the subsurface of the source-body junction (e.g., the interface between region 22 and region 41), thereby providing high carrier injection from source region 22.

Transistor 12 can be at least partially covered by an insulative layer and is preferably part of an ultra-large scale integrated (ULSI) circuit that includes one million or more transistors. Conductive vias can be provided through the insulative layer to connect to regions 22 and 24.

Figure 2:
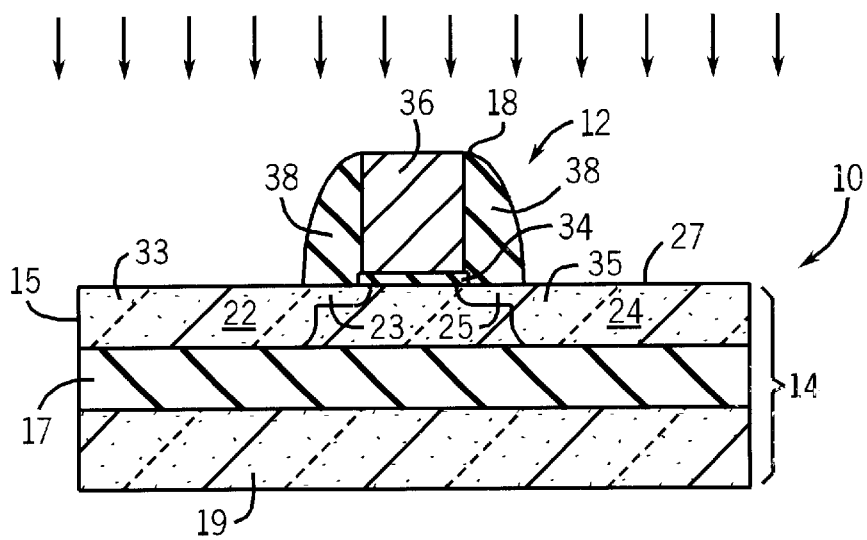
FIG. 2 is a cross-sectional view of the portion of the integrated circuit illustrated in FIG. 1, showing a gate structure formation step.
Figure 3:
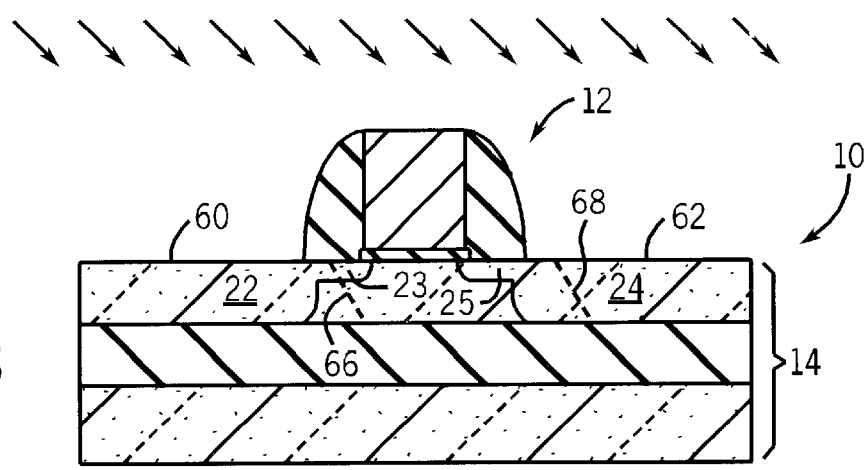
FIG. 3 is a cross-sectional view of the portion of the integrated circuit illustrated in FIG. 1, showing a tilted angle dopant implant step.

With reference to FIGS. 1–3, the fabrication of transistor 12, including source region 22 and region 24 is described below as follows. The advantageous process allows a partially depleted transistor 12 with asymmetric regions 22 and 24 to be formed.

In FIG. 2, portion 10 includes transistor 12 substantially formed by conventional IC fabrication processes. For example, a conventional double implant process can be utilized to form source region 22 and drain region 24 including extensions 23 and 25, respectively.

Substrate 14 is embodied as an SOI substrate including a layer 15 above a layer 17. Layer 15 can be a 50–200 nanometer silicon film above a silicon dioxide material, such as layer 17. Substrate 14 can be a conventional SOI substrate available from wafer manufacturers. Layer 15 can be doped for appropriate channel characteristics.

Layer 15 includes a gate stack or structure 18 on top surface 27 of layer 15. Material for gate dielectric layer 34 can be thermally grown as a 15–25 Å thick silicon dioxide layer or top surface 27. Material for gate conductor 36 can be deposited by chemical vapor deposition (CVD) over layer 34. The material for conductor 36 can be a 800–1200 Å thick polysilicon or metal layer.

The stack associated with the material for conductor 36 and layer 34 can be lithograhically patterned and etched in a conventional lithographic process to form dielectric layer 34 and conductor 36 of gate structure 18. Spacers 38 can be formed in a conventional CVD and dry etch back process.

In one embodiment, spacers 38 can be silicon dioxide spacers or silicon nitride spacers. Deep source region 33 and deep drain region 35 can be doped in a conventional implantation process after spacers 38 are formed, and source and drain extensions 23 and 25 can be doped in a conventional implantation process before spacers 38 are formed.

In a preferred embodiment, dopants for source region 22 and drain region 24 are medium or light mass dopants, such as, boron or fluorine. As shown in FIG. 2, source region 22 and drain region 24 are symmetrical and do not include the advantageous junction 52 described with reference to FIG. 1. Various doping processes can be utilized to form regions 22 and 24.

After the formation of transistor 12 as shown in FIG. 2, a high temperature annealing process can be performed. The high temperature annealing process can be a rapid thermal anneal (RTA) to activate dopants in regions 22 and 24. Various alternative conventional processes can be utilized to form the structures and regions shown in FIG. 2.

With reference to FIG. 3, portion 10 is subjected to an angled dopant implant to form junction 52 (FIG. 1). The angled dopant implant can be performed at an angle of 20–70° from a top surface 27 of layer 15 (FIG. 1) to implant dopants from a source location side 60 to a drain location side 62. Preferably, an N-type dopant, such as arsenic, is accelerated to an energy of 10–40 KeV at a dose of $10^{15}$ dopants per centimeter squared to form N-type regions delineated by dashed lines 66 and 68 (for an N-channel transistor). The implant extends from top surface 27 to bottom 55 of layer 15. A cap layer can protect conductor 36 during this implantation step.

Due to the tilt angle associated with the angled dopant implant, line 66 extends underneath gate structure 18 while line 68 is set apart from gate structure 18. The shadowing effect associated with gate structure 18 protects the area underneath extension 25 from the N-type dopants. Alternatively, for a P-channel transistor, P-type dopants, such as Indium, can be accelerated to an energy of 30–100 KeV at a dose of $10^{15}$ dopants per centimeters squared to form P-type regions delineated by dashed lines 66 and 68.

Preferably, the angled implant accelerates heavy mass dopants to an energy of 10–100 KeV at a dose of $10^{15}$ dopants per centimeter squared. The heavy mass dopants can include arsenic for N-channel MOSFETs or indium for P-channel MOSFETs.

Lines 66 and 68 define point-defect-abundant layers. The regions defined by lines 66 and 68 can be amorphous or partially amorphous due to the implantation step.

With reference to FIG. 1, portion 10 is subjected to a laser annealing process. The laser annealing process can utilize an excimer laser (308 nm, pulse duration a few nanoseconds). Preferably, the regions defined by dashed lines 66 and 68 become molten and are recrystallized after the laser beam is removed. The recrystallization process forms an abrupt junction 52 (an abrupt lateral junction on the source side of transistor 12). Preferably, the duration of the laser pulse is several nanoseconds, thereby preventing adverse affects of a high thermal budget.

In one embodiment, the annealing process can raise the temperature of regions defined by lines 66 and 68 to the melting temperature of the regions (1100° C. for amorphous silicon germanium). The melting temperature of the regions in the amorphous state is significantly lower than that of substrate 14 (layer 15) which is in a crystalline state. For example, the melting temperature of amorphous silicon germanium is 1100° C. and the melting temperature of a single crystalline silicon substrate (C—Si) is 1400° C. Preferably, the laser fluence is controlled so that the regions defined by lines 66 and 68 are fully melted and layer 15 is not melted. After the laser beam is removed, regions defined by lines 66 and 68 are recrystallized as a single crystalline material. The annealing process can be a solid phase epitaxy process.

After annealing, conventional fabrication processes and techniques can be utilized to form silicide layers, interconnects, contacts, etc. An insulative layer can be deposited over gate structure 18.

It is understood that, while preferred embodiments, examples, materials, and values are given, they are for the purpose of illustration only. The apparatus and method of the invention are not limited to the precise details and conditions disclosed. Although certain implant characteristics are discussed, other methods could be utilized to dope the source/drain regions. Thus, changes may be made to the details disclosed without departing from the spirit of the invention, which is defined by the following claims.

What is claimed is:

1. A method of manufacturing an integrated circuit, comprising:

providing a gate structure between a source location and a drain location on a semiconductor film;

providing a source region at the source location and a drain region at the drain location;

providing an angled dopant implant angled in a single direction from the source location to the drain location, to form an amorphous region in the film; and annealing the film to recrystallize the amorphous region, whereby the source region includes an abrupt junction.

2. The method of claim 1, further comprising providing a pair of spacers abutting lateral sides of the gate structure, before providing the angled dopant implant.

3. The method of claim 2, wherein the angled dopant implant is performed at an angle between 20–70 degrees.

4. The method of claim 3, wherein the angled dopant implant uses a heavy mass dopant.

5. The method of claim 4, wherein the heavy mass dopant is arsenic or indium.

6. The method of claim 1, wherein the annealing step is a laser annealing step.

7. The method of claim 6, wherein a single crystal region under the gate structure in the film serves as a seed layer.

8. The method of claim 7, wherein the annealing uses lateral solid phase epitaxy.

9. A method of manufacturing an integrated circuit, comprising:
providing a gate structure between a source location and a drain location on a semiconductor film;
providing a source region at the source location and a drain region at the drain location;
providing an angled dopant implant to form an amorphous region in the film; and
annealing the film to recrystallize the amorphous region, wherein the annealing step is a laser annealing step, wherein a single crystal region under the gate structure in the film serves as a seed layer, wherein the annealing uses lateral solid phase epitaxy, wherein the annealing forms a dopant single crystal region having a very abrupt vertical junction underneath a source extension of the source region.

10. The method of claim 1, wherein the source region is formed with boron or fluorine dopants and the angled dopant implant is performed with arsenic or indium.

11. A method of manufacturing an SOI transistor having reduced floating-body effects, the method comprising steps of:
providing at least part of a gate structure on a top surface of a semiconductor substrate, the gate structure having a pair of spacers;
doping a deep source region and a deep drain region in the semiconductor substrate;
doping the entire deep source region under one of the spacers while not doping the deep drain region under the other of the spacers, with a tilt implant, the tilt implant being performed in a direction from the deep source region to the deep drain region to form an abrupt junction below a source extension of the deep source region; and
annealing the semiconductor substrate.

12. The method of claim 11, wherein the second doping step forms an amorphous region and the annealing step recrystallizes the amorphous region in the semiconductor substrate formed in the second doping step.

13. The method of claim 12, wherein the recrystallizing is a lateral solid phase epitaxy step.

14. The method of claim 12, wherein the amorphous region is formed with the tilt implant at an angle between 20 and 70 degrees with respect to a top surface of the semiconductor.

15. The method of claim 11, wherein the tilt implant is performed at an angle between 20 and 70 degrees.

16. The method of claim 11, wherein a super abrupt source junction is formed.

17. The method of claim 16, wherein the super abrupt source junction is in the lateral direction.

18. A method of doping a source region and/or a drain region for a transistor, the transistor includes a gate structure disposed over a channel in a substrate, a source region heavily doped with dopants of a first conductivity type, and a drain region heavily doped with dopants of the first conductivity, the method comprising:
amorphizing the substrate at an angle with dopants of the first conductivity type, the angle being in a direction from the source region to the drain region; and
annealing the substrate, whereby an abrupt junction in the lateral direction for the source region is formed, the source region and the drain region being asymmetrical.

19. The method of claim 18, wherein the abrupt junction is below an extension of the source region.

20. A method of doping a source region and/or a drain region for a transistor, the transistor includes a gate structure disposed over a channel in a substrate, a source region heavily doped with dopants of a first conductivity type, and a drain region heavily doped with dopants of the first conductivity type, the method comprising:
amorphizing the substrate at an angle with dopants of the first conductivity type; and
annealing the substrate, whereby an abrupt junction in the lateral direction for the source region or the drain region is formed, the source region and the drain region being asymmetrical, wherein the abrupt junction is below an extension of the source region or the drain region, wherein the annealing step recrystallizes the substrate with an excimer laser.

* * * * *